(12) United States Patent
Moraveji (10) Patent No.: US 7,502,719 B2
(45) Date of Patent: Mar. 10, 2009

(54) METHOD AND APPARATUS FOR OVERSHOOT AND UNDERSHOOT ERRORS CORRECTION IN ANALOG LOW DROPOUT REGULATORS

(75) Inventor: Farhood Moraveji, Saratoga, CA (US)

(73) Assignee: Monolithic Power Systems, Inc., San Jose, CA (US)

( * ) Notice: Subject to any disclaimer, the term of this patent is extended or adjusted under 35 U.S.C. 154(b) by 0 days.

(21) Appl. No.: 11/698,675

(22) Filed: Jan. 25, 2007

(65) Prior Publication Data

US 2008/0180071 A1 Jul. 31, 2008

(51) Int. Cl.
*G06F 11/30* (2006.01)
*G21C 17/00* (2006.01)
(52) U.S. Cl. ....................................... 702/185
(58) Field of Classification Search ................... 702/64, 702/69, 107, 117, 183–185
See application file for complete search history.

(56) References Cited

U.S. PATENT DOCUMENTS

| 5,512,859 | A  | * | 4/1996 | Moraveji | 330/267 |
| 2006/0006928 | A1 | * | 1/2006 | Utsuno | 327/541 |
| 2006/0055388 | A1 | * | 3/2006 | Tang et al. | 323/284 |

* cited by examiner

*Primary Examiner*—Michael P Nghiem
(74) *Attorney, Agent, or Firm*—Perkins Coie LLP (57) ABSTRACT

The present invention provides a method and apparatus for dynamically correcting overshoot and undershoot errors in an analog integrated circuit by improving the reaction time ($\Delta t$) of the analog integrated circuit. Equivalently, an error correction circuit is disclosed including an overshoot correction circuit and an undershoot correction circuit that are only activated to reduce overshoot and undershoot errors by increasing the bandwidth of the integrated circuit when either undershoot or overshoot errors are detected.

15 Claims, 8 Drawing Sheets

METHOD AND APPARATUS FOR OVERSHOOT AND UNDERSHOOT ERRORS CORRECTION IN ANALOG LOW DROPOUT REGULATORS

FIELD OF THE INVENTION

The present invention relates generally to the field of analog integrated circuits. More specifically, the present invention relates to analog voltage regulators.

BACKGROUND ART

Voltage regulators that provide clean output signals are essential to the performance of analog integrated circuits. This is especially true when analog integrated circuits are used in portable electronic devices such as digital cameras, cellular phones, and laptop computers that require low quiescent currents and a low supply voltage from 1.9 volts to 3.3 volts. Transient responses of these analog integrated circuits can cause irreversible failure and often shorten the lifetime of these portable devices. Low drop-out voltage regulator circuits are widely used because they provide a stable, low noise and well specified DC output voltage for integrated circuits. However, low drop-out voltage regulator circuits are vulnerable to transient overshoot and undershoot errors that are caused by the switching on and off of a downstream load device.

Figure 1A:
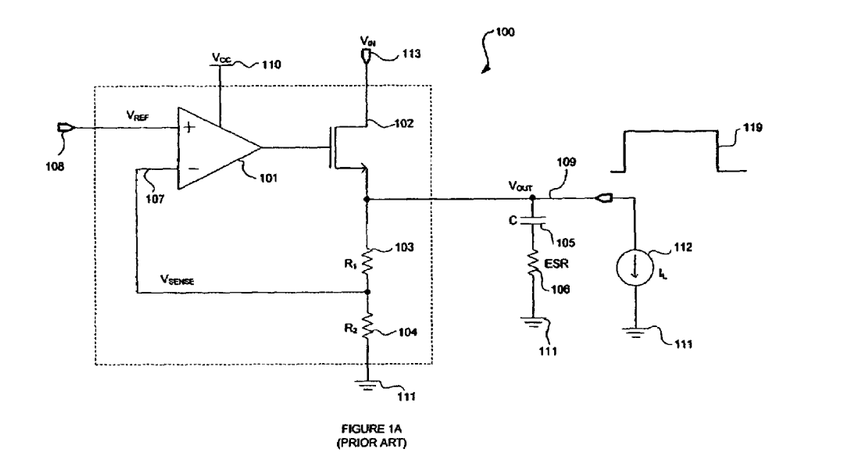
FIG. 1A illustrates a schematic diagram of a prior art low drop-out voltage regulator that is vulnerable to overshoot and undershoot problems.
Figure 1B:
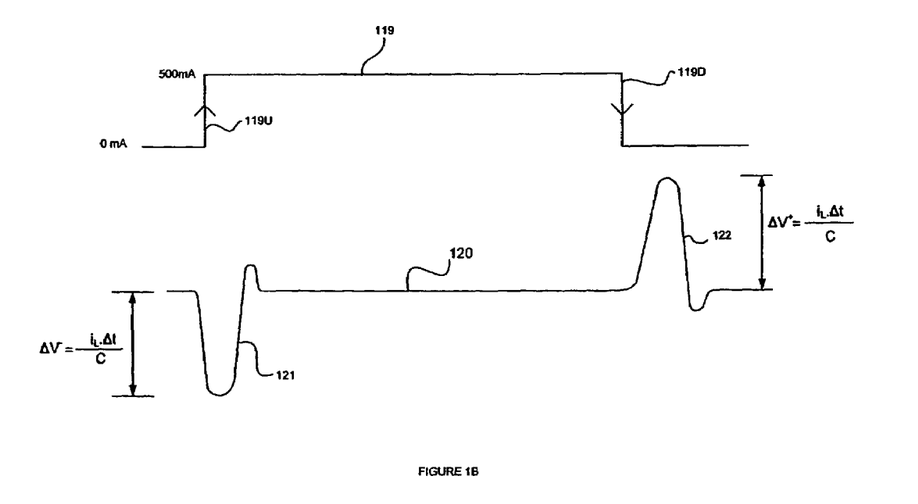
FIG. 1B illustrates waveforms of the load current and the output signal of the prior art low drop-out voltage regulator circuit of FIG. 1A.

With reference to the schematic diagram of FIG. 1A, a prior art low drop-out voltage regulator circuit 100 connected to a downstream load device represented by a load current 112 is shown that includes an error amplifier 101, a pass device 102, and a reference network including a first resistor ($R_1$) 103 and a second resistor ($R_2$) 104. Low drop-out voltage regulator circuit 100 produces an output voltage ($V_{OUT}$) independent of the input voltage ($V_{IN}$) and proportional to a reference voltage ($V_{REF}$). FIG. 1B shows a waveform 119 representing load current 112 and a waveform 120 representing the output signal ($V_{OUT}$). When load current 112 is turned on, the current increases from 0 mA to 500 mA which is represented by a rising edge 119U of waveform 119. In response, the voltage on capacitor 105 decreases but low drop-out voltage regulator circuit 100 does not react fast enough to compensate for the sudden drop in the output voltage ($V_{OUT}$). As a result, an undershoot error 121 exists in the transient response of the output signal ($V_{OUT}$). The magnitude of undershoot error 121 is $\Delta V^- = I_L \cdot \Delta t / C$ (Equation 1), where C is the capacitance of capacitor 105.

Continuing with FIG. 1B, when load current 112 is turned off, the current decreases from 500 mA to 0 mA which is represented by a falling edge 119D of waveform 119. In response, the voltage of capacitor 105 increases but low drop-out voltage regulator circuit 100 does not react fast enough to stop compensating for the output voltage ($V_{OUT}$) which is represented by a waveform 120. This results in an overshoot error 122 in output waveform 120. The magnitude of overshoot error 122 is $\Delta V^+ = I_L \cdot \Delta t / C$ (Equation 2). Typically, in order to solve undershoot error 121 and overshoot error 122 in low drop-out voltage regulator circuit 100, a large capacitor 105 between 10 µF and 100 µF is connected to the output terminal 109 and an electrical ground 111. Large capacitance C in the denominator of Equation 1 and Equation 2 reduces the magnitude of $\Delta V^-$ and $\Delta V^+$. However, large capacitor 105 requires a significant amount of board area as well as increases in manufacturing costs. In addition, large capacitor 105 tends to slow the response time of low drop-out voltage regulator circuit 100. On the other hand, reducing the value of capacitor 105 speeds up the reaction time but may cause instability and an increase the overshoot (equation 2) in low drop-out voltage regulator circuit 100. Therefore, changing the capacitance (C) of capacitor 105 is not feasible to handle overshoot and undershoot problems. Another method is to reduce the reaction time ($\Delta t$) in equations 1 and 2 by using very fast error amplifier 101. However, fast error amplifiers require expensive process technology and complex circuit design. Thus, additional circuitry is needed to solve the transient overshoot and undershoot errors in low drop-out voltage regulator 100.

Many prior arts have attempted to provide additional circuitry to solve the overshoot and undershoot errors problems in low drop-out voltage regulator 100. In one prior art, an output stage compensation circuit electrically coupled between error amplifier 101 and pass device 102 is disclosed. Inside the prior art's output stage compensation circuit, one or more segmented sense devices are configured to provide pole-zero compensation to low drop-out voltage regulator circuit 100 based on output current. Each of the segmented sense devices is configured to compensate a suitable range of output current and to multiply the effect of associated compensation capacitors. As a result, the output stage of compensation circuit of the prior art provides a stable output voltage ($V_{OUT}$) which is not dependent upon the output current and the capacitance requirements. However, the disclosed output stage compensation circuit does not address overshoot error and undershoot error problems. Furthermore, the prior art circuits do not provide a solution to low quiescent current requirements and economy in silicon area.

Accordingly, there are unmet needs for a method and an overshoot and undershoot correction circuit that enable low drop-out voltage regulator circuits to achieve fast reaction time so as to solve for the overshoot error and undershoot error problems. In addition, there is an unmet need for an overshoot and undershoot correction circuit that does not consume a large amount of quiescent currents and occupy large circuit board area. The present invention meets the above needs.

SUMMARY OF THE INVENTION

The present invention provides a method and apparatus for correcting overshoot and undershoot errors by improving the reaction time ($\Delta t$) of an analog integrated circuit, or, equivalently, dynamically increasing the bandwidth of the analog integrated circuit is when the undershoot and undershoot errors are detected. In other words, the present invention provides an apparatus that is only activated when overshoot and undershoot errors are detected to increase the speed (reducing $\Delta t$) of the loop bandwidth of an analog integrated circuit.

An error correction circuit for an analog integrated circuit is disclosed that includes an undershoot correction circuit and a separate overshoot correction circuit. When an undershoot error is detected, the undershoot correction circuit is turned on and causes the analog integrated circuit to immediately start compensating for the undershoot errors. And when an overshoot error is detected, the overshoot correction circuit is turned on, which turns off the pass transistor and thus stops providing current that charges the output capacitor.

A method of correcting overshoot and undershoot errors in an analog circuit is also disclosed that includes the steps of sensing for undershoot and overshoot errors in an analog integrated circuit using an error correction circuit that includes an undershoot correction circuit and an overshoot correction circuit, whenever an undershoot error or an overshoot error is detected, activating either undershoot or overshoot correction circuit so as to generate a corrective signal, and using the corrective signal to cause the analog integrated circuit to react faster (decreasing Δt, increasing the loop bandwidth) and thus substantially reducing the undershoot and overshoot errors. One of the advantages of the present invention is that the overshoot and undershoot correction circuits consume minimal quiescent power because they are in the off mode during normal operating condition.

A low drop-out voltage regulator that uses a low input offset error amplifier and the error correction circuit is also disclosed. The low input offset error amplifier has a fast reaction time (Δt), a low DC offset input voltage, an improved noise and distortion performance so that it can effectively work with the error correction circuit to further solve the overshoot and undershoot problems in low drop-out voltage regulator circuits. The low input offset error amplifier of the present invention includes an input differential stage, a gain stage, and an output stage. The gain stage, electrically coupled between the input differential stage and the output stage, is operable to provide the gain for the error amplifier and to prevent the offset currents from reflecting back to the input differential stage by using common-mode feedback scheme.

These and other advantages of the present invention will no doubt become obvious to those of ordinary skill in the art after having read the following detailed description of the preferred embodiments, which are illustrated in the various drawing Figures.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

Figure 2:
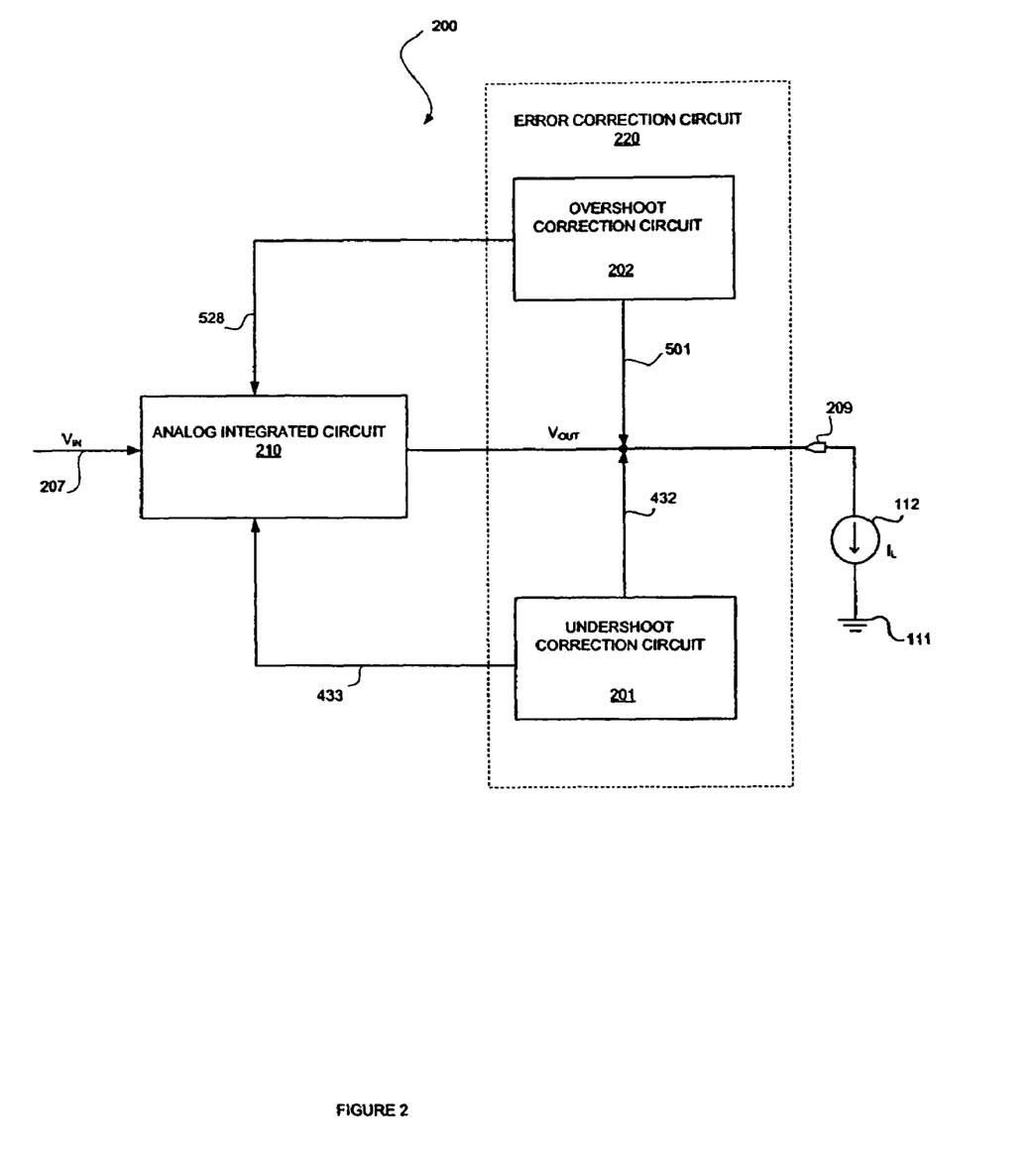
FIG. 2 illustrates a block diagram of an analog integrated circuit (IC) electrically connected to an error correction circuit that includes an overshoot correction circuit and a separate undershoot correction circuit in accordance with an embodiment of the present invention.

Referring to FIG. 2, an error correction circuit electrically coupled to address the overshoot and undershoot errors in an analog integrated circuit (IC) system in accordance with an embodiment of the present invention is illustrated. An analog integrated system 200 includes an analog integrated circuit 210 electrically connected to an error correction circuit 220. According to an embodiment of the present invention, error correction circuit 220 further includes an undershoot correction circuit 201 and a separate overshoot correction circuit 202. Undershoot correction circuit 201 is used to address undershoot errors and overshoot correction circuit 202 is used to address overshoot errors.

Structurally, analog integrated circuit 210 includes an input terminal 207 that receives an input voltage ($V_{IN}$) and an output terminal 209 that produces an output voltage ($V_{OUT}$). Output terminal 209 is also connected to a downstream load represented by load current 112 connected in series to electrical ground 111. It is noted that within the scope of the present invention, analog integrated circuit 210 can be but not limited to low drop-out voltage regulators, analog amplifiers, analog operational-amplifiers (op-amps), analog to digital converters (ADC), or any analog integrated circuits that are vulnerable to the transient undershoot and undershoot errors. Furthermore, the terms undershoot error and overshoot error mean a transient response in the output signal ($V_{OUT}$) due to square waveform 119 of load current 112 as illustrated in FIG. 1B. However, it is noted that, any unwanted transient signals in the output voltage ($V_{OUT}$) are covered within the meanings of the terms error in the present invention.

Referring again to FIG. 2, undershoot correction circuit 201 is separate and different from overshoot correction circuit 202. Undershoot correction circuit 201 and overshoot correction circuit 202 are electrically coupled to analog integrated circuit 210 to separately address undershoot and overshoot errors in output voltage ($V_{OUT}$). Undershoot correction circuit 201 has an input terminal 432 and an output terminal 433. Input terminal 432 is electrically connected to receive output voltage ($V_{OUT}$) of analog integrated circuit 210. As soon as an undershoot error in the output signal ($V_{OUT}$) is detected, undershoot correction circuit 201 is activated and produces a corrective signal at output terminal 433, immediately causing analog integrated circuit 210 to compensate for the output signal ($V_{OUT}$). In other words, undershoot error circuit 201 reduces the reaction time Δt of analog integrated circuit 210. More particularly, referring again to Equation 1, $\Delta V^- = I_L \cdot \Delta t/C$, given C and $I_L$ unchanged, if the reaction time Δt is significantly reduced, the magnitude of the undershoot error $\Delta V^-$ will also be significantly reduced. This means that the bandwidth of analog integrated circuit 210 is dynamically increased when needed when the undershoot and undershoot errors are detected.

Over all, overshoot correction circuit 202 operates in the same principle as undershoot correction circuit 201. However, overshoot correction circuit 202 also creates an electrical path to compensate the overshoot error. Overshoot correction circuit 202 has an input terminal 501 and an output terminal 528. Input terminal 501 is electrically coupled to receive the output voltage ($V_{OUT}$) while output terminal 528 is electrically connected to analog integrated circuit 210. As soon as an overshoot error is detected, overshoot correction circuit 202 issues a corrective signal at output terminal 528, causing analog integrated circuit 210 to immediately compensate the overshoot error in the output voltage ($V_{OUT}$). At the same time, overshoot correction circuit 202 creates an electrical path so that the excess voltage of the overshoot error can be reduced. In other words, overshoot error circuit 202 reduces the reaction time Δt of analog integrated circuit 210 or dynamically increases the overall system bandwidth. More particularly, referring again to Equation 2, $\Delta V^+ = I_L \cdot \Delta t/C$, given C and $I_L$ remained the same, if the reaction time Δt is significantly reduced, the magnitude of the overshoot error $\Delta V^+$ will also be significantly reduced.

In conclusion, analog integrated system 200 with separate undershoot correction circuit 201 and overshoot correction circuits 202 can produce clean output signal ($V_{OUT}$) without undershoot and overshoot errors. Furthermore, since overshoot correction circuit 202 and undershoot correction circuit 201 are only activated when overshoot error and undershoot error are detected, error correction circuit 220 efficiently addresses and solves undershoot and overshoot errors in the output signal ($V_{OUT}$) without consuming a large amount of quiescent current. Low quiescent current translates to low power consumption.

Figure 3:
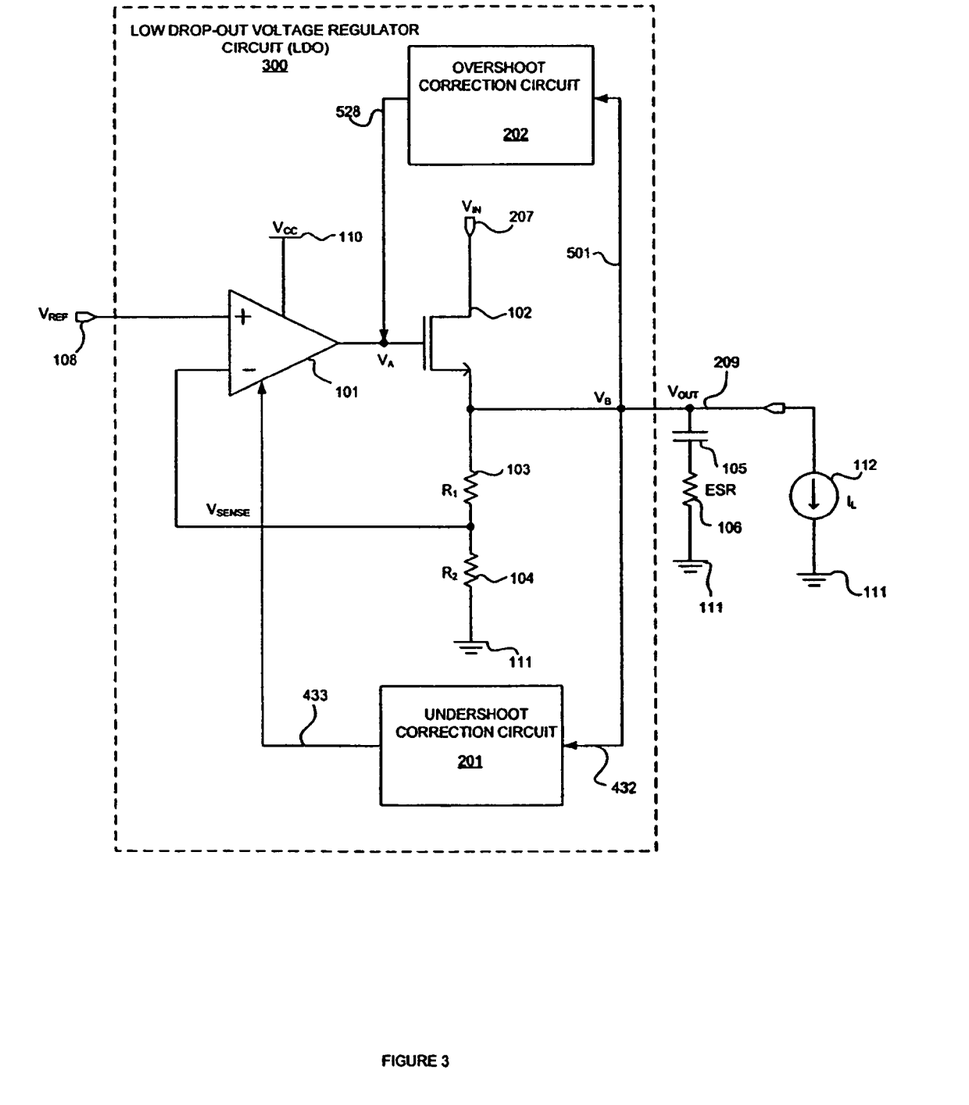
FIG. 3 illustrates a schematic diagram of a low drop-out voltage regulator circuit that uses the error correction circuit of FIG. 2 to reduce undershoot error and overshoot error in accordance with an embodiment of the present invention.

Now referring to FIG. 3, a schematic diagram of a low drop-out voltage regulator 300 that includes overshoot correction circuit 202 and undershoot correction circuit 201 of the present invention to reduce the overshoot and undershoot errors is illustrated. Input terminal 432 of undershoot correction circuit 201 is electrically connected to output terminal 209 at node $V_B$ to detect undershoot errors in output signal ($V_{OUT}$). Output terminal 433 of undershoot correction circuit 201 is electrically coupled to an output stage (not shown) of error amplifier 101. As soon as undershoot error occurs in the output signal ($V_{OUT}$), undershoot correction circuit 201 issues a corrective signal to cause error amplifier 101 to react right away and thus improving the reaction time Δt of low drop-out voltage regulator circuit 300.

Continuing with FIG. 3, input terminal 501 of overshoot correction circuit 202 is electrically connected to output terminal 209 at node $V_B$ to sense the output signal ($V_{OUT}$) to detect any overshoot thereon. Output terminal 528 is electrically connected to the gate of pass transistor 102 at node $V_A$. In a normal condition where there is no overshoot error, the voltage at the gate of pass transistor 102 is greater than the output signal ($V_{OUT}$). However, when the output current on output terminal 209 is suddenly decreased from 500 mA to 0 mA, pass transistor 102 is not immediately turned off, causing output signal ($V_{OUT}$) at node $V_B$ to increase. This results in overshoot error in the transient response of output signal ($V_{OUT}$) as shown in FIG. 1B. As soon as the overshoot error is detected; overshoot correction circuit 202 is activated and produces a corrective signal to prevent pass transistor 102 from compensating for the output signal ($V_{OUT}$) and thus prevent the pass transistor 102 from further supplying current to capacitor. Therefore the overshoot error is eliminated.

Figure 4:
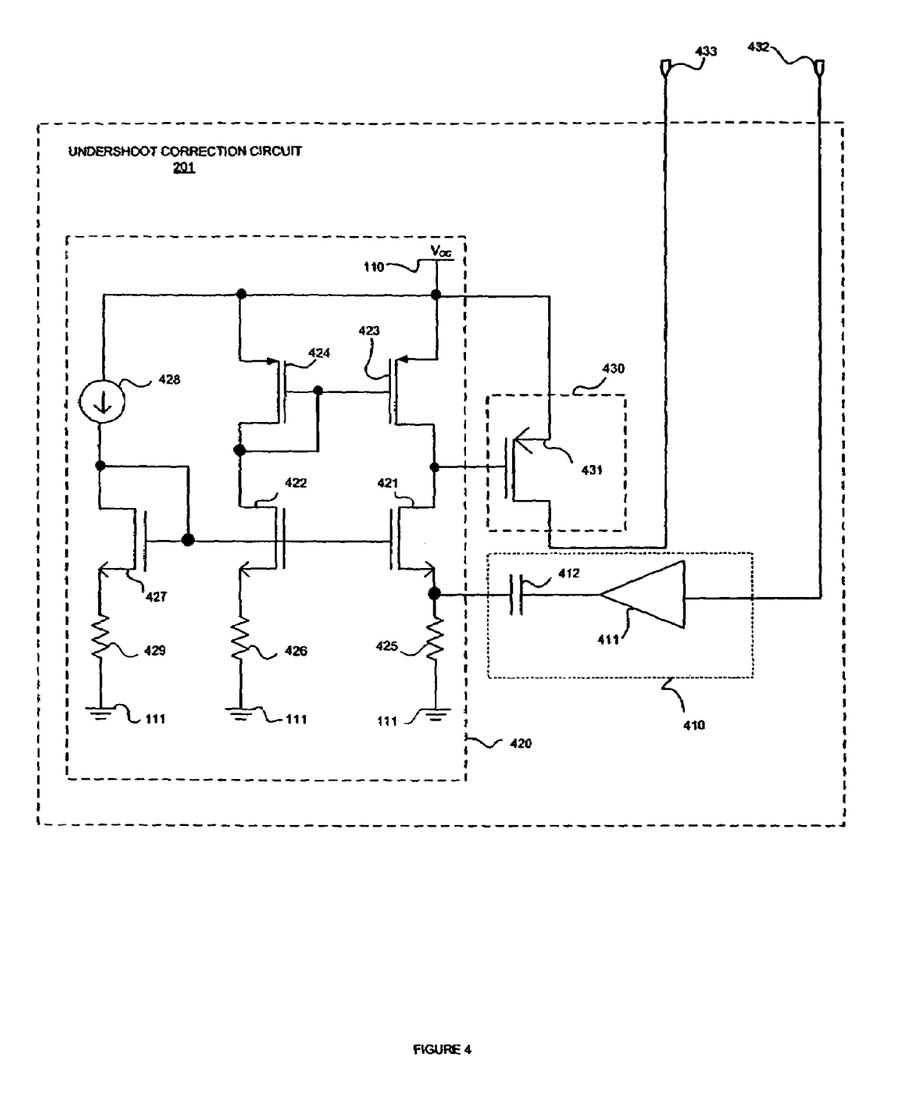
FIG. 4 illustrates a complete schematic diagram of an undershoot correction circuit in accordance with an embodiment of the present invention.

Referring next to FIG. 4, a detailed schematic diagram of undershoot correction circuit 201 in accordance with an embodiment of the present invention is illustrated. Undershoot correction circuit 201 operates as described above and includes an input stage circuit 410 electrically coupled to a differential stage circuit 420, and an output stage circuit 430. In one embodiment of the present invention, input stage circuit 410 includes a buffer 411 electrically connected in series to a capacitor 412. The input of buffer 411 is electrically connected to input terminal 432. The output terminal of buffer 411 is coupled to differential stage circuit 420 via capacitor 412. In one embodiment, buffer 411 is a fast AB class buffer. In one embodiment, buffer 411 is a simple buffer used for buffering output signal ($V_{OUT}$) Any voltage drop caused by undershoot error in output signal ($V_{OUT}$) in buffer 411 will cause capacitor 412 to discharge. Differential stage circuit 420 is a fast amplifier that includes a first NMOS transistor 421 and a second NMOS transistor 422. The gate of first NMOS transistors 421 is electrically connected to the gate of second NMOS transistor 422. The source of first NMOS transistor 421 is electrically connected to a first resistor 425 and to capacitor 412. The source of second NMOS transistor 422 is electrically connected to a second resistor 426. The second terminals of both first resistor 425 and second resistor 426 are electrically connected to electrical ground 111. First NMOS transistor 421 and second NMOS transistor 422 are biased by a biasing circuitry that includes a first current source 428, a first PMOS transistor 423, a second PMOS transistor 424, and a third NMOS transistor 427. The gate of first PMOS transistor 423 is electrically connected to the gate and the drain of second PMOS transistor 424. The drain of first PMOS transistor 423 is, in turn, connected to the drain of first NMOS transistor 421 and to output stage circuit 430. The drain of second PMOS transistor 424 is electrically connected to the drain second NMOS transistor 422 and to the gates of first PMOS transistor 423 and second PMOS transistor 424. The source of first NMOS transistor 423 is electrically connected to the source of second PMOS transistor 424 and to a supply voltage ($V_{cc}$) 110. The first terminal of current source 428 is electrically connected to supply voltage ($V_{cc}$) 110. The other terminal of current source 428 is electrically connected to the drain and the gate of third NMOS transistor 427. The gate of third NMOS transistor 427 is electrically connected to the gates of first NMOS transistor 421 and second NMOS transistor 422. The source of third NMOS transistor 427 is electrically connected to a third resistor 429. The other terminal of resistor 429 is electrically connected to electrical ground 111. Output stage 430 includes a PMOS transistor 431. The gate of PMOS 431 is electrically connected to the drains of first PMOS transistor 423 and first NMOS transistor 421. The source of PMOS transistor 431 is electrically connected to supply voltage ($V_{cc}$) 110. Finally, the drain of PMOS transistor 431 forms output terminal 433. In one embodiment, resistors 425, 426, and 429 are 100 KΩ, first current source 428 is 4 μA, and the supply voltage ($V_{cc}$) 110 is 2.5 volts. In one embodiment of the present invention, first current source 428 is a resistor (not shown) electrically connected between supply voltage ($V_{cc}$) 110 and the drain-gate of third NMOS transistor 427. In one embodiment, first current source 428 is an active current mirror that produces a constant biasing current.

Figure 5:
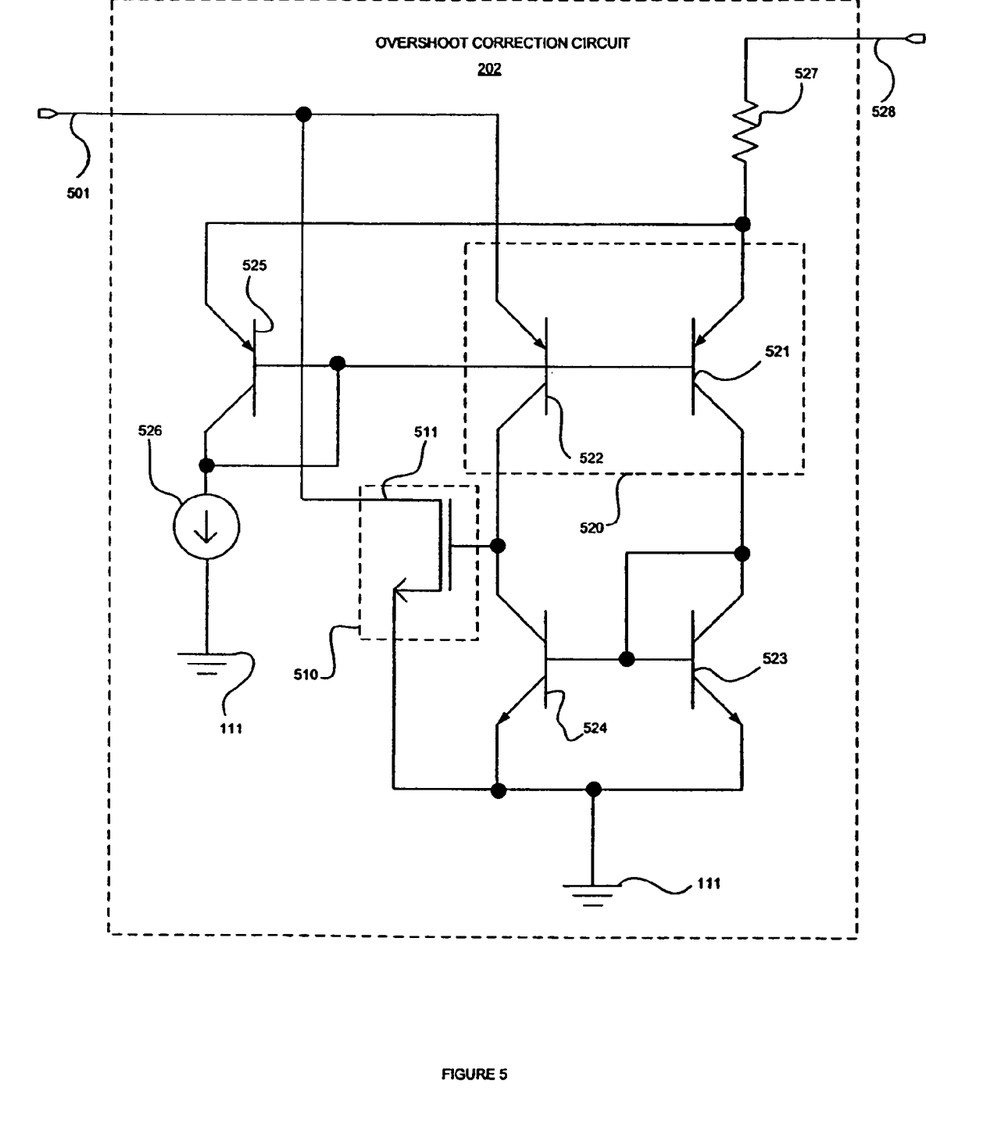
FIG. 5 illustrates a complete schematic diagram of an overshoot correction circuit in accordance with an embodiment of the present invention.

Referring now to FIG. 5, the schematic diagram of overshoot correction circuit 202 in accordance with an embodiment of the present invention is now shown in details. Overshoot correction circuit 202 includes an output stage circuit 510 electrically coupled to a differential stage circuit 520. In one embodiment of the present invention, output stage 510 includes an NMOS transistor 511. Differential stage 520 includes a first pnp bipolar junction transistor 521 and a second pnp bipolar junction transistor 522 which are biased by a biasing circuitry that include a first npn bipolar junction transistor 523, a second npn bipolar junction transistor 524, a third pnp bipolar junction transistor 525, and a constant current source 526. More particularly, the emitter of first pnp bipolar junction transistor 521 is electrically connected to the first terminal of a resistor 527. The other terminal of resistor 527 forms output terminal 528. The base of first pnp bipolar junction transistor 521 and the base of second pnp bipolar junction transistor 522 are electrically connected together. The collector of first pnp bipolar junction transistor 521 is electrically connected to the collector and the base of first npn bipolar junction transistor 523; while the collector of second pnp bipolar junction transistor 522 is electrically connected to the collector of second npn bipolar junction transistor 524. The bases of both first npn bipolar junction transistor 523 and second npn bipolar junction transistor 524 are connected together. The emitters of first npn bipolar junction transistor 523 and second npn bipolar junction transistor 524 are connected together and to electrical ground 111. The base of first pnp bipolar junction transistors 521 and the base of second pnp bipolar junction transistor 522 are electrically connected to the base of third pnp bipolar junction transistor 525. The collector of third pnp bipolar 525 is electrically connected to its base and to constant current source 526. The other side of constant current source 526 is electrically connected to electrical ground 111. In one embodiment of the present invention, constant current source 526 has a constant current value of 10 μA. The emitter of third pnp bipolar junction transistor 525 is electrically connected to the emitter of first npn bipolar junction transistor 521 and to the first terminal of resistor 527. The emitter of second pnp bipolar junction transistor 522 is electrically connected to the drain terminal of NMOS transistor 511 of output stage circuit 510. The gate of NMOS transistor 511 is electrically connected to the collector junction of second pnp bipolar junction transistor 522 and second npn bipolar junction transistor 524. The source of NMOS transistor 511 is electrically connected to electrical ground 111. The drain of NMOS transistor 511 is electrically connected to the emitter of second pnp bipolar junction transistor 522 and to input terminal 501.

Figure 6:
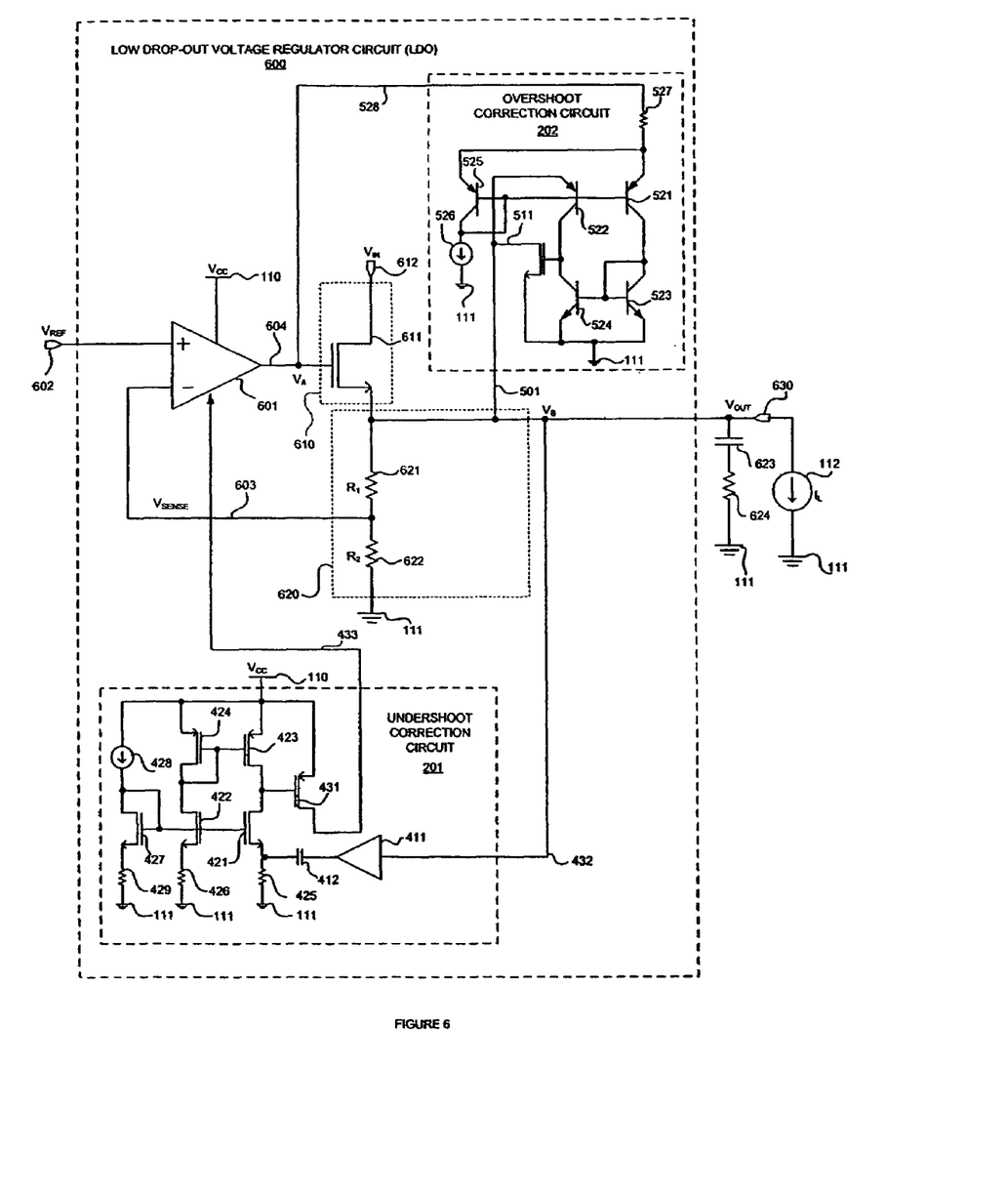
FIG. 6 illustrates a complete schematic diagram of a low drop-out voltage regulator integrated circuit with the error correction circuit in accordance with an embodiment of the present invention.

Now referring to FIG. 6, a complete schematic diagram of low drop-out voltage regulator (LDO) circuit 600 that has undershoot correction circuit 201 and overshoot correction circuit 202 in accordance with an embodiment of the present invention is shown. In an embodiment of the present invention, analog integrated system 200 of FIG. 2 is a low drop-out voltage regulator circuit 600 that includes error amplifier 601, pass device 610, overshoot correction circuit 202, and undershoot correction circuit 201, all fabricated on the same chip. In one embodiment of the present invention, error amplifier 601 is a prior art error amplifier 101. In another embodiment, error amplifier 601 is a low input offset error amplifier 700 which will be described later. Error amplifier 601 includes a first input terminal (positive input terminal) 602, a second input terminal (negative input terminal) 603, and an output terminal 604. First input terminal 602 receives a reference voltage ($V_{REF}$) which can be generated by a reference voltage source (not shown). Second input terminal 603 receives a sampled and scaled signal ($V_{SENSE}$) from pass device 610. In one embodiment of the present invention, pass device 610 is an NMOS transistor 611. The drain of NMOS transistor 611 is connected to an input terminal 612 of low drop-out voltage regulator 600 where an unregulated input signal ($V_{IN}$) is received. The gate of NMOS transistor 611 is connected in series to output terminal 604 of error amplifier 601. The source of NMOS transistor 611 is connected to a feedback circuit 620 that further includes a first sampling resistor ($R_1$) 621, a second sampling resistor ($R_2$) 622. The source of NMOS transistor 611 is also connected to capacitor 623 having a capacitance C. The other terminal of capacitor 623 is connected in series with ESR resistor 624. The other terminal of ESR resistor 624 is electrically connected to electrical ground 111. ESR resistor 624 is the "Equivalent Series Resistance" of capacitor 623.

More particularly, the source of NMOS transistor 611 is connected to first sampling resistor 621. First sampling resistor ($R_1$) 621 is connected in series with second sampling resistor ($R_2$) 622 and to second input terminal 603 of error amplifier 601. The other terminal of second sampling resistor ($R_2$) 622 is electrically connected to electrical ground 111.

Continuing with the description of low drop-out voltage regulator circuit 600 of FIG. 6, input terminal 432 of undershoot correction circuit 201 is electrically connected to output terminal 630 of NMOS transistor 611 at node $V_B$ to sense the output voltage ($V_{OUT}$) for any undershoot error. The output signal ($V_{OUT}$) is buffered by buffer 410 of undershoot correction circuit 201. The output terminal 433 of undershoot correction circuit 201 is electrically coupled to an output stage (not shown) of error amplifier 601 so that when an undershoot error occurs, undershoot correction circuit 201 cause error amplifier 601 to issue a corrective signal to NMOS transistor 611. Input terminal 501 of overshoot correction circuit 202 is electrically connected to output terminal 630 to sense output voltage ($V_{OUT}$) for any overshoot error at node $V_B$. The output terminal 528 is connected to control the gate of NMOS transistor 611 at node $V_A$. Output terminal 630 of low drop-out voltage regulator circuit 600 is electrically connected to a load represented by load current 112 having a current $I_L$ and capacitor 623.

With reference to the description of FIG. 6 above, the principle of operation of low drop-out voltage regulator circuit 600 can be described as follows. Error amplifier 601 compares voltage reference ($V_{REF}$) with sampled and scaled output voltage ($V_{SENSE}$) and generates a corrective signal to regulate the voltage drop across NMOS transistor 611 such that condition $V_{REF}=V_{SENSE}$ is fulfilled. When output signal ($V_{OUT}$) does not have any undershoot error or overshoot error, undershoot correction circuit 201 and overshoot correction circuit 202 are in a cutoff state. However, when undershoot error is detected at input terminal 432, undershoot correction circuit 201 is activated and causes error amplifier 601 to react faster to compensate for the undershoot error in output signal ($V_{OUT}$). More particularly, in a normal operating condition without undershoot error, voltage level at input terminal 432 is at DC value of output signal ($V_{OUT}$). This voltage level is buffered at buffer 411. First NMOS transistor 421 is in cutoff mode because second NMOS transistor 422 is turned on and drawing more current from gate to electrical ground 111. This is because second NMOS transistor 422 is physically larger than first NMOS transistor 421. As a result, first NMOS transistor 421 is turned off because its gate voltage is pulled to electrical ground 111 by second NMOS transistor 422. Under normal operating conditions, active bias current source configured by first PMOS transistor 423 and second PMOS transistor 424 is biased so that PMOS transistor 431 in the cutoff state, no current flowing out of output terminal 433. Thus, under normal condition when there is no undershoot error at output terminal 630, undershoot correction circuit 201 is in high impedance state, i.e., no current flowing out at output terminal 433.

Referring again to FIG. 6, when an undershoot error occurs, buffer 411 quickly senses the voltage drop at input terminal 432. As a result, a corresponding voltage drop occurs at the other side of capacitor 412. A voltage drop is observed across second resistor 425 of the source of first NMOS transistor 421. In response to this voltage drop at the source, the voltage gap between gate and source widens and second NMOS transistor 422 is turned on, pulling the voltage at the gate of PMOS transistor 431 toward electrical ground 111. PMOS transistor 431 is now turned on and raises the voltage at output terminal 433 to supply voltage ($V_{cc}$) 110. The increase in the voltage at output terminal 433 causes error amplifier 601 to react and start compensating for the undershoot error. Thus, when undershoot error occurs at output terminal 630, undershoot correction circuit 201 is in low impedance state and causes current to flow from output terminal 433 to error amplifier 601.

Continuing with FIG. 6, in a normal operating condition where there is no overshoot error detected at output terminal 630, overshoot correction circuit 202 is in a cutoff condition. More particularly, when overshoot error is not detected, the voltage at the gate of NMOS transistor 611 at node $V_A$ is higher than the voltage at output terminal 630. As such, in overshoot correction circuit 202, the voltage at output terminal 528 is higher than the voltage at input terminal 501. Equivalently, the voltage at the emitter of pnp bipolar junction transistor 521 is higher than that of pnp bipolar junction transistor 522. In such condition, first pnp bipolar junction transistor 521 conducts more than second pnp bipolar junction transistor 522. Thus, more current flows on the collector of diode-connected npn bipolar junction transistor 524. As a result, current mirror formed by npn bipolar junction transistors 523 and 524 will cause npn bipolar junction transistor 524 to turn on, pulling the gate of NMOS transistor 511 toward electrical ground 111. In normal operating conditions, NMOS transistor 511 is in a cutoff mode; and therefore, overshoot correction circuit 202 is in the high impedance state.

On the other hand, as soon as overshoot error is detected at input terminal 501, overshoot correction circuit 202 is activated to dissipate the overshoot error. More particularly, when the normal operating condition is reversed and overshoot error is detected, the increase in voltage of overshoot error 122 as shown in FIG. 1B causes the voltage at input terminal 501 to be higher than the voltage at output terminal 528. In response, second pnp bipolar junction transistor 522 is turned on while first pnp bipolar junction transistor 521 is turned off. This causes current to flow on the collector of second pnp bipolar junction transistor 522, and pulling its output to a high state. Now NMOS transistor 511 is turned on, dumping the excess voltage of the overshoot error to electrical ground 111. In the meantime, first pnp bipolar junction transistor 521 is turned off.

Figure 7:
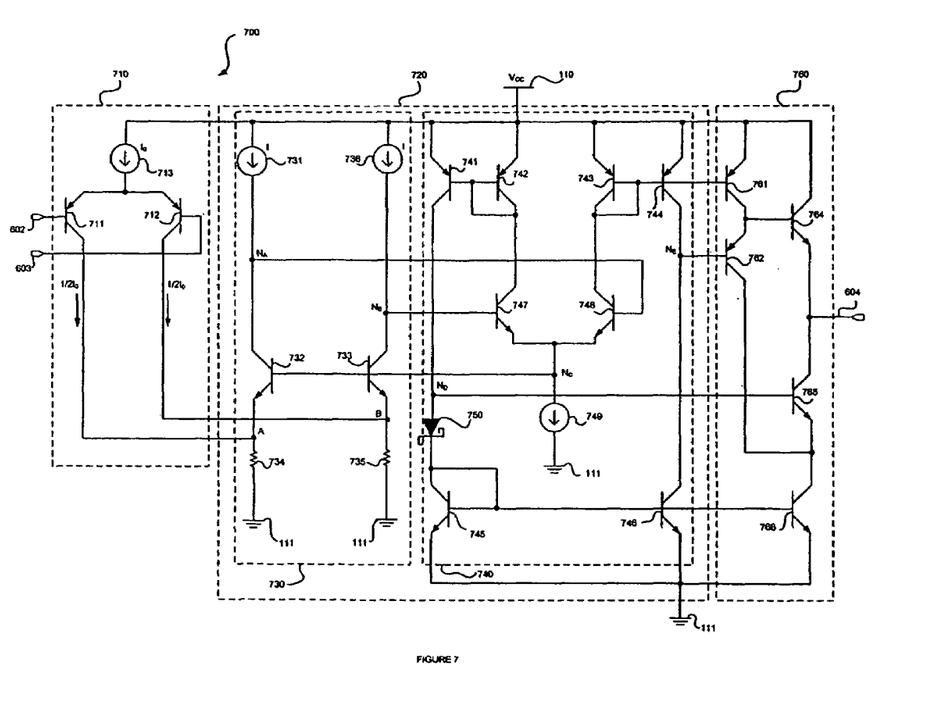
FIG. 7 illustrates a complete schematic diagram of a low input offset error amplifier used in a low drop-out voltage regulator circuit to reduce the overshoot error and the undershoot error in a low drop-out voltage regulator in accordance with an embodiment of the present invention.

Now referring to FIG. 7, in an embodiment of the present invention, error amplifier 601 used in low drop-out voltage regulator 600 comprises a low input offset error amplifier 700. Low input offset error amplifier 700 of the present invention includes an input differential stage 710, a gain stage 720, and an output stage 760. Input differential stage 710 is configured by pnp bipolar junction transistors 711 and 712, forming a transconductance amplifier. Gain stage 720, electrically coupled between input differential stage 720 and output stage 760, is operable to provide the gain for low offset error amplifier 700 and to prevent the offset currents from reflecting back to input differential stage 710. In order to achieve such results, gain stage 720 further includes a cascode circuit 730 and an operational amplifier (op-amp) circuit 740. Cascode circuit 730, configured by cascode bipolar transistors 732 and 733, is electrically coupled to the input differential stage 710 to form a differential folded cascode circuit. Op-amp circuit 740 includes a differential pair 747-748, a plurality of curror mirrors 741-742, 743-744, and 745-746. Op-amp circuit 740 is electrically coupled in series to provide common mode biases to the differential folded cascode circuit so that offset current is not reflected to input differential stage 710.

In operation, in order to achieve very low input offset voltage, error amplifier 700 uses a common-mode feedback scheme to hold the collector voltage of gain block 730, more particularly, transistors 732 and 733, at a constant DC voltage which is 2 times the base emitter voltage ($2*V_{BE}$) above electrical ground 111. Differential pair 747 and 748 in op-amp block 740 will servo the collectors of transistors 732 and 733 to its base voltage. Therefore, node $N_A$ and $N_B$ have the same common-mode DC voltage. As such, error amplifier 700 minimizes the induced DC offset at input stage due to Early Effect of bipolar transistors 732 and 733. In addition, this embodiment of the present invention will provide a differential voltage which will be more immuned to noise.

Figure 8:
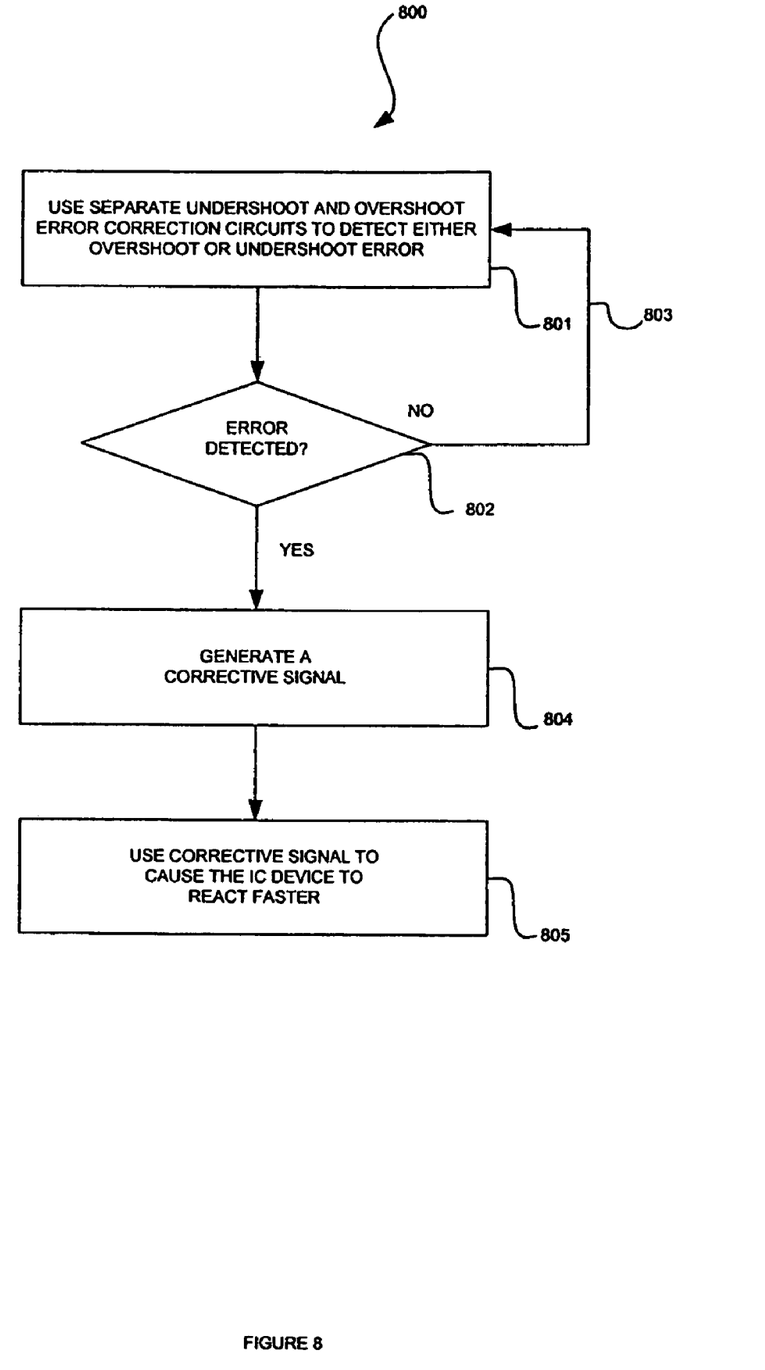
FIG. 8 illustrates a flow chart of a method of correcting overshoot and undershoot errors in analog integrated circuits in accordance with an embodiment of the present invention.

Referring now to FIG. 8, a flow chart 800 showing of a method of reducing undershoot and overshoot errors in analog integrated circuits is illustrated. Method 800 includes the steps of detecting whether an undershoot or an overshoot error occurs in the output signal using a separate overshoot correction circuit and undershoot correction circuit, when either an undershoot error or an overshoot error is detected, then generating a corrective signal, and using the corrective signal to spur the analog integrated circuit to react faster to reduce the undershoot or overshoot error. Method 800 reduces overshoot and undershoot errors in the output signal by improving the reaction time ($\Delta t$) of the analog integrated circuit without consuming a large amount of quiescent currents. Equivalently, method 800 dynamically adjusts the loop bandwidth of an analog integrated circuit whenever either an undershoot error or an overshoot error is detected. Furthermore, in the occurrence of overshoot error, creating an electrical path to dissipate excess energy carried in the overshoot error.

Now referring to step 801, the output signal of an analog integrated system is sensed using the undershoot correction circuit and overshoot correction circuit. The input terminal of overshoot correction circuit is coupled to sense the output voltage of the analog integrated for any overshoot error. The undershoot correction circuit is used to sense the output voltage for any undershoot error. Step 801 can be implemented using undershoot correction circuit 201 and overshoot correction circuit 202 of the present invention. Undershoot correction circuit 201 is coupled to sense the output voltage ($V_{OUT}$) of analog integrated system 600. A sudden drop in the output voltage level is detected by high speed class AB buffer 411. On the other hand, overshoot correction circuit 202 senses the output voltage ($V_{OUT}$) by comparing it with the voltage at node $V_A$ at the gate of NMOS transistor 611. In the normal operating condition where there is no overshoot, the voltage at node $V_A$ is greater than the output voltage ($V_{OUT}$). When load current 112 is disconnected, it causes an increase in output voltage ($V_{OUT}$) as shown in waveform 122 in FIG. 1B. At that moment, the output voltage ($V_{OUT}$) is greater than the voltage at node $V_A$. Overshoot correction circuit 202 detects the change in the voltage relationship between node $V_A$ and output terminal 630.

Now referring to step 802, after the output voltage is sensed, determine whether overshoot error or an undershoot error has been detected. That is, determine whether the status quo condition of either he overshoot correction circuit or the undershoot correction circuit is changed. Step 803 is implemented by differential stage circuit 420 of undershoot correction circuit 201 and differential stage 520 of overshoot correction circuit 202. In the normal operating condition, differential stage 420 is a cutoff mode. That is, first NMOS transistor 421 and first PMOS transistor 431 are in cutoff mode. As soon as there is a voltage drop at input terminal 432, buffer 411 would detect this voltage drop. The voltage across resistor 425 decreases accordingly. The decrease in the voltage across resistor 425 would cause first NMOS transistor 421 to become conduct and thus sinks the gate of PMOS transistor 431 toward electrical ground 111, turning on PMOS transistor 431. As a result, output terminal 433 becomes high and corrective signal is sent out. Similarly, the electrical characteristics of differential stage 520 of overshoot correction circuit 202 are changed when overshoot error is detected at input terminal 501. In normal operating condition, first pnp bipolar junction transistor 521 is off and second pnp bipolar junction transistor 522 is on. When an overshoot error occurs, output voltage ($V_{OUT}$) increases, causing second NMOS transistor 521 to turn on. As a result, first pnp bipolar junction transistor 521 turns off. Thus, the state of overshoot correction circuit 202 is changed upon the occurrence of an overshoot error.

Now referring to step 803, when there is no change in the output voltage ($V_{OUT}$), the electrical characteristics of undershoot correction circuit 201 and overshoot correction circuit 202 do not change. Step 804 continues to step 802.

Referring to step 804, a corrective signal is issued when the electrical characteristics of either undershoot correction circuit and overshoot correction circuit has been changed. Step 805 is implemented by PMOS transistor 431 of undershoot correction circuit 201 and second pnp bipolar junction transistor 522 of overshoot correction circuit 202. More particularly, when the current state of undershoot correction circuit 201 is changed, PMOS transistor 431 is turned ON, pulling output terminal 433 to supply voltage ($V_{cc}$) 110 and thus sending a corrective signal to error amplifier 601. In case of overshoot correction circuit 202, the increase in the base current of first pnp bipolar junction transistor 521 caused by a decrease in the base current of second npn bipolar junction transistor 522. As a result, output terminal 528 sees a voltage drop across resistor 527.

Finally, referring to step 805, corrective signal causes analog integrated circuit to react promptly to undershoot error and overshoot error. Thus, step 806 improves the reaction time Δt of the analog integrated circuit, and thus reducing the amplitude of undershoot error and overshoot error. Step 805 is implemented by the signal at output terminal 433 of undershoot correction circuit 201. Corrective signal causes error amplifier 601 to produce correcting current at the gate of pass transistor 611, thus compensating for the undershoot problem. On the other hand, the corrective signal causes pass transistor 611 to turn off, thus eliminating the overshoot problem. Furthermore, in one embodiment of the present invention, method 800 also includes a step of providing an electrical discharge path for output signal so that overshoot error can be dumped. This step is implemented by the electrical path formed by NMOS transistor 511.

Obviously many modifications and variations of the present invention are possible in light of the above teachings. It is therefore to be understood that within the scope of the appended claims the invention may be practiced otherwise than as specifically described. It should be understood, of course, the foregoing disclosure relates only to a preferred embodiment (or embodiments) of the invention and that numerous modifications may be made therein without departing from the spirit and the scope of the invention as set forth in the appended claims. Various modifications are contemplated and they obviously will be resorted to by those skilled in the art without departing from the spirit and the scope of the invention as hereinafter defined by the appended claims as only a preferred embodiment(s) thereof has been disclosed.

What is claimed is:

1. An error correction circuit for an analog integrated circuit having an input terminal and an output terminal, comprising:

an undershoot correction circuit electrically coupled to detect an undershoot error in said analog integrated circuit, said undershoot correction circuit operable to improve the reaction time of said analog integrated circuit only when said undershoot error is detected at said output terminal; and an overshoot correction circuit electrically coupled to detect an overshoot error in said analog integrated circuit, said overshoot correction circuit operable to improve the reaction time of said analog integrated circuit only when said overshoot error is detected at said output terminal; wherein said undershoot correction circuit further comprises:

an input stage circuit including an input terminal electrically coupled to detect said undershoot error at said output terminal of said analog integrated circuit;

a differential stage circuit electrically coupled to said input terminal; and an output stage circuit electrically coupled to said differential stage circuit and to said analog integrated circuit, as soon as said undershoot error is detected, said differential stage circuit and said output stage circuit are activated to generate a corrective signal that improves the reaction time of said analog integrated circuit;

wherein said input stage circuit comprises a high speed class AB buffer electrically coupled to a capacitor.

2. An error correction circuit for an analog integrated circuit having an input terminal and an output terminal, comprising:

an undershoot correction circuit electrically coupled to detect an undershoot error in said analog integrated circuit, said undershoot correction circuit operable to improve the reaction time of said analog integrated circuit only when said undershoot error is detected at said output terminal; and an overshoot correction circuit electrically coupled to detect an overshoot error in said analog integrated circuit, said overshoot correction circuit operable to improve the reaction time of said analog integrated circuit only when said overshoot error is detected at said output terminal; wherein said undershoot correction circuit further comprises:

an input stage circuit including an input terminal electrically coupled to detect said undershoot error at said output terminal of said analog integrated circuit;

a differential stage circuit electrically coupled to said input terminal; and an output stage circuit electrically coupled to said differential stage circuit and to said analog integrated circuit, as soon as said undershoot error is detected, said differential stage circuit and said output stage circuit are activated to generate a corrective signal that improves the reaction time of said analog integrated circuit;

wherein said differential stage circuit further comprises:

a first NMOS transistor electrically coupled to a second NMOS transistor, the gate of said first NMOS transistor is electrically connected to the gate of said second NMOS transistor, the source of said first NMOS transistor electrically coupled to the first terminal of a first resistor and to said input stage circuit, the second terminal of said first resistor is electrically coupled to an electrical ground, the source of said second NMOS transistor electrically coupled to the first terminal of a second resistor, the second terminals of said second resistor electrically coupled to said electrical ground; and a biasing circuitry electrically coupled to said first NMOS transistor and said second NMOS transistor, wherein said biasing circuitry is operable to bias said first NMOS transistor and said second NMOS transistor, the collectors of said first NMOS transistor and said second NMOS transistor electrically coupled to said biasing circuitry and said output stage circuit.

3. The error correction circuit of claim 2 wherein said biasing circuitry comprises a first current source comprising a first PMOS transistor and a second PMOS transistor, the gate of said first PMOS transistor electrically coupled to the gate of said second PMOS transistor, the drain of said first PMOS transistor electrically coupled to the drain of said first NMOS transistor and to said output stage circuit, the drain of said second PMOS transistor electrically coupled the drain of said second NMOS transistor and to its gate, the source of said first PMOS transistor electrically coupled to the source of said second NMOS transistor and to a supply voltage; and a second current source having a first terminal and a second terminal, said first terminal electrically coupled to said supply voltage;

a third NMOS transistor having the drain electrically coupled to a second terminal of said second current source, the gate of said third NMOS transistor electrically coupled to the drain and to the gates of said first NMOS transistor and said second NMOS transistor, the source of said third NMOS transistor electrically coupled to the first terminal of a third resistor, the second terminal of said third resistor electrically coupled to said electrical ground.

4. The error correction circuit of claim 3 wherein said output stage circuit is a PMOS transistor, the gate of said PMOS transistor electrically coupled to the drain of said first NMOS transistor, the drain of said PMOS transistor forming said output terminal and electrically coupled to said analog integrated circuit, and the source electrically coupled to said supply voltage.

5. An error correction circuit for an analog integrated circuit having an input terminal and an output terminal, comprising:

an undershoot correction circuit electrically coupled to detect an undershoot error in said analog integrated circuit, said undershoot correction circuit operable to improve the reaction time of said analog integrated circuit only when said undershoot error is detected at said output terminal; and an overshoot correction circuit electrically coupled to detect an overshoot error in said analog integrated circuit, said overshoot correction circuit operable to improve the reaction time of said analog integrated circuit only when said overshoot error is detected at said output terminal;

wherein said overshoot correction circuit further comprises:

a differential stage circuit electrically coupled to said output terminal of said analog integrated circuit; and an output stage circuit electrically coupled to said differential stage circuit and to said analog integrated circuit;

wherein said differential stage circuit further comprising:

a first pnp bipolar junction transistor electrically coupled to a second pnp bipolar junction transistor, the base of said first pnp bipolar junction transistor is electrically connected to the base of said second pnp bipolar junction transistor, the emitter of said first pnp bipolar junction transistor electrically coupled to the first terminal of a resistor, the second terminal of said resistor electrically coupled to said analog integrated circuit, the emitter of said second pnp bipolar junction transistor electrically forming said input terminal and coupled to receive said output signal of said analog integrated circuit; and biasing circuitry electrically coupled to said first pnp bipolar junction transistor and said second pnp bipolar junction transistor, said biasing circuitry operable to bias said differential stage, the collectors of said first pnp bipolar junction transistor and said second pnp bipolar junction transistor electrically coupled to said biasing circuitry.

6. The error correction circuit of claim 5 wherein said biasing circuitry comprises:

a first current source comprising a first npn bipolar junction transistor and a second npn bipolar junction transistor, the base of said first npn bipolar junction transistor electrically coupled to the base of said second npn bipolar junction transistor, the collector of said first npn bipolar junction transistor electrically coupled to its base and to the collector of said first pnp transistor, the collector of said second npn bipolar junction transistor electrically coupled to the collector of said second pnp bipolar junction transistor and to said output stage circuit, the emitter of said first npn bipolar junction transistor electrically coupled to the emitter of second npn transistor and to an electrical ground;

a second current source having a first terminal and a second terminal, the first terminal electrically coupled to said electrical ground; and a third pnp bipolar junction transistor, the collector of said third pnp transistor electrically coupled to its base and to the bases of first pnp, second pnp bipolar junction transistors, and to the second terminal of said second current source, the emitter of said third pnp bipolar junction transistor electrically coupled to the first terminal of said resistor and to the emitter of said first pnp bipolar junction transistor.

7. The error correction circuit of claim 6 wherein said output stage circuit comprises an NMOS transistor, the gate of said NMOS transistor electrically coupled to the collector of said second pnp bipolar junction transistor, the drain of said NMOS transistor electrically coupled to said analog integrated circuit and to the emitter of said second pnp bipolar junction transistor, the source of said NMOS transistor electrically coupled to said electrical ground.

8. A low drop-out (LDO) voltage regulator circuit, comprising:
   an error amplifier comprising a first input terminal, a second input terminal, and an output terminal;
   a pass device electrically coupled in series to said output terminal of said error amplifier for receiving a corrective signal from said error amplifier; and
   an error correction circuit further comprising:
      an undershoot correction circuit electrically coupled to detect an undershoot error in an output signal of said low drop-out voltage regulator circuit, said undershoot correction circuit operable to substantially reduce said undershoot error by improving the reaction time of said low drop-out voltage regulator circuit, wherein as soon as said undershoot error is detected, said undershoot correction circuit is activated and operable to immediately cause said low drop-out voltage regulator circuit to start compensating for said output signal; and
      an overshoot correction circuit electrically coupled to detect an overshoot error in said output signal, said overshoot correction circuit operable to substantially reduce said overshoot error by improving the reaction time of said low drop-out voltage regulator circuit, wherein as soon as said overshoot error is detected, said overshoot correction circuit is activated and operable to immediately prevent said pass device from further supplying current to said output signal.

9. The low drop-out voltage regulator circuit of claim 8 wherein said undershoot correction circuit is in a cutoff state when said undershoot error is not detected and when said undershoot error is detected, said undershoot correction circuit is activated and operable to cause said low drop-out voltage regulator circuit to start compensating for said output signal so that said undershoot error is substantially reduced, said undershoot error correction further comprises:
   an input stage circuit including an input terminal electrically coupled to detect said undershoot error;
   a differential stage circuit electrically coupled to said input terminal; and
   an output stage circuit electrically coupled to said differential stage circuit and to said error amplifier.

10. The low drop-out voltage regulator circuit of claim 8 wherein said overshoot correction circuit is in a cutoff state when said overshoot error is not detected and wherein when said overshoot error is detected, said undershoot correction circuit is turned on and operable to cause said error amplifier to stop compensating for said output signal, said overshoot correction circuit further comprising:
   a differential stage circuit electrically coupled to detect said overshoot error in said low drop-out voltage regulator circuit; and
   an output stage circuit electrically coupled to said differential stage and to said error amplifier.

11. The low drop-out voltage regulator circuit of claim 8 wherein said pass device is a power transistor further comprises a gate terminal, a source terminal, and a drain terminal, said gate terminal electrically coupled to said output terminal of said error amplifier and said drain terminal electrically coupled to receive said corrective signal from said error amplifier.

12. The low drop-out voltage regulator circuit of claim 8 further comprising a divider network electrically coupled to said output terminal of said error amplifier and said pass device.

13. The low drop-out voltage regulator circuit of claim 8 wherein said error amplifier is a low input offset error amplifier that further comprises:
   an input differential stage;
   a gain stage electrically coupled to said input differential stage, said gain stage further comprises a cascode circuit electrically coupled to an operational amplifier (op-amp) circuit; and
   an output stage electrically coupled to said op-amp circuit.

14. The low drop-out voltage regulator circuit of claim 13 wherein said op-amp circuit further comprises a differential pair electrically coupled to a plurality of current mirrors, and wherein said op-amp circuit and said cascode circuit forms a common mode feedback loop and wherein said op-amp circuit provides a common mode bias to said cascode circuit.

15. The low drop-out voltage regulator circuit of claim 8 wherein said cascode circuit further comprises a first cascode transistor and a second cascode transistor electrically coupled together and to said input differential stage to form a folded cascode differential pair.

* * * * *